United States Patent [19]

Nath et al.

[11] Patent Number: 4,586,988

[45] Date of Patent: May 6, 1986

[54] METHOD OF FORMING AN ELECTRICALLY CONDUCTIVE MEMBER

[75] Inventors: Prem Nath, Rochester; Bela Fischer, Birmingham, both of Mich.

[73] Assignee: Energy Conversion Devices, Inc., Troy, Mich.

[21] Appl. No.: 524,797

[22] Filed: Aug. 19, 1983

[51] Int. Cl.$^4$ .............................................. C25D 5/02
[52] U.S. Cl. .................................... 204/15; 204/32.1; 204/35.1
[58] Field of Search ...................... 204/15, 38.1, 38.5, 204/28, 40, 32.1, 34.5, 35.1

[56] References Cited

U.S. PATENT DOCUMENTS

| | | | |
|---|---|---|---|
| 3,529,961 | 9/1970 | Schaefer | 204/15 |
| 4,143,253 | 3/1979 | Wagner | 204/15 |
| 4,144,139 | 3/1979 | Durkee | 204/15 |
| 4,205,428 | 6/1980 | Ernstoff | 204/15 |
| 4,227,975 | 10/1980 | Hartman | 204/15 |
| 4,251,327 | 2/1981 | Grenon | 204/15 |
| 4,320,250 | 3/1982 | Corwin | 204/15 |
| 4,322,571 | 3/1982 | Stanbery | 204/15 |
| 4,399,004 | 8/1983 | Buckley | 204/15 |
| 4,410,758 | 10/1983 | Grolitzer | 204/15 |

*Primary Examiner*—T. M. Tufariello
*Attorney, Agent, or Firm*—Ronald W. Citkowski; Marvin S. Siskind; Lawrence G. Norris

[57] ABSTRACT

A method of depositing a preselected pattern of electrically conductive metallic material onto a layer of relatively transparent electrically conductive material. In its broadest form the method includes the single step of electroplating the electrically conductive metallic material onto the transparent conductive layer. The method has particular utility in electroplating metal grid patterns onto the indium tin oxide layer of an amorphous thin film photovoltaic device.

22 Claims, 6 Drawing Figures

METHOD OF FORMING AN ELECTRICALLY CONDUCTIVE MEMBER

FIELD OF THE INVENTION

This invention relates generally to electronic devices and more particulary to those photovoltaic devices, photodetectors, liquid crystal displays and the like, which incorporate therein a transparent electrode. Disclosed herein is a plating process for forming an electrically conductive pattern upon the transparent electrode of the abovementioned devices.

BACKROUND OF THE INVENTION

In its broadest sense, this invention describes a method of forming, via an electrodeposition process, metallic regions which exhibit high electrical conductivity upon a layer of transparent electrically conductive material. A great many electronic devices such as photovoltaic cells, photodetectors, liquid crystal displays and the like incorporate at least one electrode which must be relatively transparent to light. These transparent electrodes are preferably formed from a transparent conductive oxide (TCO) material, such as, inter alia. indium-tin oxide (ITO). In spite of the electrical conductivity of the TCO material, it is often necessary to have a metallic region or regions of yet higher electrical conductivity formed upon the transparent electrode. In some instances, the electrical conductivity of the TCO material is too low to efficiently collect all of the generated current. In such cases an electrically conductive, metallic grid pattern formed of a material having a higher electrical conductivity than the TCO material must be placed upon the transparent electrode to provide a high efficiency, low resistance current path thereacross. For example, in the fabrication of large area photovoltaic devices a grid pattern is formed atop the transparent electrode, so as to provide a lower resistance path for the collection of photogenerated current.

In other instances, it is necessary to form the aforementioned metallized region or regions upon the transparent conductive electrode in order to provide points for electrical connection to the electrode. For example, in liquid crystal display devices it is necessary to establish electrical contact between the control circuitry associated therewith and the transparent electrode of the display device. Such contact is established through the metallization of regions of the transparent electrode.

In still other instances it may be necessary to deposit a metalized region, to serve a reflecting function, upon the transparent conductive electrode thereof. This may be the case in, for example, (1) photovoltaic cells wherein a reflective layer functions to increase efficiency, or (2) display devices wherein image contrast and/or aesthetic appeal is increased by the addition of a light reflecting region upon the electrode. In view of the number of diverse functions and geometries of the metallized region(s) formed upon TCO materials according to the method of the instant invention, the terms "metallic pattern" or "metallic region" as used herein are defined to include metallized regions of all configurations; including, but not limited to continuous layers, discontinuous layers, stripes, grids, networks and the like, which regions may cover either all or part of the TCO material. The definition of metallic pattern is not meant to be limited by the function of the pattern, but, rather includes patterns that function as electrical conductors, thermal conductors, light reflectors, heat reflectors, decorative trim, etc.

The methods heretofore used for applying these metallic regions upon a layer of transparent electrode material have proven less then satisfactory. Vacuum coating processes such as sputtering, evaporation, or ion-plating represent one method of providing metallized regions. However, vacuum coating processes have inherent limitations which render them undesirable; (1) by definition, all of these processes require a vacuum, and accordingly utilize relatively expensive and complicated equipment; (2) these processes are time consuming; and (3) the processes require highly skilled operators.

In other instances the conductive patterns formed by the metallic regions are applied in a printing process. A conductive material such as (1) metallic ink may be applied by an offset type printing process, or (2) conductive paste may be applied through stenciling or screen printing processes. These techniques, while inexpensive, result in the application of conductive materials of limited utility, since said conductive materials incorporate organic binders which tend to either contaminate the electronic device produced therefrom or interfere with further processing steps. Additionally, the aforementioned conductive materials, having relatively low conductivities, must be applied in fairly thick layers in order to perform adequately. Furthermore, soldered joints are not easily made to these organic binder-containing conductive materials. Also, reliablity and serviceability of printed conductive patterns is less then adequate, since they are easily damaged in handling or processing and degrade with time.

A variation of the aforementioned printing process involves the use of metal resinates. These commercially available resinates comprise metallic atoms complexed with an organic material. In use, the resinates are (1) applied to the substrate in a desired pattern, and (2) fired at high temperatures so that the organic material is volatilized leaving a residue layer of metal in the conductive pattern. While the metallic layer thus produced is electrically adequate for many of the purposes discussed hereinabove, the high cost of the metal resinates, the time consuming nature of the process, and the high temperatures used in the processing thereof place severe limitations on the use of this technique. For example, even disregarding cost, the metal resinate technique could not be utilized to form contacts or grid patterns on thin film amorphous photovoltaic devices, since the high processing temperatures (300°-600° C.) would crystallize the amorphous semiconductor layers.

Electroless, or autocatalytic, plating represents a partial solution to the problems associated with forming conductive patterns such as metallic contacts upon transparent electrodes. In electroless plating, the member to be metallized is treated with an appropriate activating material for catalyzing the precipitation of a metallic deposit thereon when the member is immersed an the appropriate plating bath. Under ideal conditions, the results thus obtained are satisfactory, although utility of the process is limited by (1) its high costs and (2) the difficulty of implementation. Cost of electroless plating is more than an order of magnitude heater than a comparable electroplating process. Furthermore, the parameters of the process must be monitored very closely in order to form a good coating. More specifically, if tolerances relating to temperature, concentration, or purity of the plating bath are not closely maintained, the conductive coatings formed on the transparent electrode exhibit problems of adhesion, surface quality, durablity, and composition. For these reasons, electroless plating baths require the use of trained personnel to constantly monitor parameters of the system.

The need therefore exists for a low cost, easily implementable, reliable conductive coating process adapted to deposit a high quality metallic layer upon the transparent electrode of a semiconductive device, such as upon the transparent conductive oxide electrode of a photovoltaic cell. Electroplating, also referred to herein as "electrodeposition", is a widely used process for depositing metallic material upon electrically conductive substrates. Electroplating has the advantages of being a cheap, easily controlled, rapid plating process for the deposition of a wide variety of metallic materials atop a substrate. However, prior to the instant invention it has not been used to deposit metallic materials upon transparent conductive oxides, such as the indium tin oxide layers found atop photovoltaic devices. While successful plating of some materials onto TCO has been reported, none of those materials were metallic ones specifically adapted for use in the aformentioned electronic and/or photovoltaic devices. For example, I. Camlibel. et al have electroplated a silver halide complex onto indium-tin oxide coated glass. This was reported in an article entitled *An Experimental Display Structure Based Uoon Reversable Electrodeposition,* "Applied Physics Letters" 33,9, 1 November 1978. While the method therein disclosed allowed for the plating of a material compound onto TCO, the deposited compound is not suitable for use as an electrical contact or electrical conductor, since its conductivity and thickness are too low.

In a second paper, electroplating of arsenic doped p type cadmium telluride onto indium tin oxide coated glass was reported by the Monosolar Corporation in a report entitled *Monosolar, Inc., DOE Photovoltaic Systems Programs Summary December* 1978, Department of Energy Publication Number DOE-ER-0075. According to the Monosolar method, layers of semiconductor material unsuitable for use as electrical contacts or electrical conductors because of their low electrical conductivity and low durability, are deposited onto the ITO coated glass.

One previously employed approach to the problem of providing electrically conductive metallic regions on transparent conductive oxides involves (1) using an electroless plating bath to deposit a first metallic layer upon the TCO, and (2) then employing that metallic layer as a base for electroplating. However, this approach is less than adequate, since it introduces an additional expensive, difficult to control, electroless plating step to the process.

Accordingly, it is a principle object of the present invention to develop a method of directly, simply, reliably and economically electroplating metallic materials, characterized by electrical conductivity and durablity, onto transparent conductive oxide. Pursuant to the method disclosed herein, high quality patterns of metallic materials may be electroplated onto transparent conductive oxide materials in a rapid, inexpensive, and easily controlled process. In addition, the method of the instant invention is compatable with both the device configurations and the processing parameters of the electronic and photovoltaic devices which incorporate transparent electrode layers. The method of the instant invention further prevents degradation of the electronic and photovoltaic devices being plated without interfering with subsequent processing steps.

These advantages are of special importance in the fabrication of photovoltaic devices which incorporate thin. film amorphous semiconductor alloy layers. Recently, considerable efforts have been made to develop systems for depositing amorphous semiconductor alloy materials, each of which can encompass relatively large areas, and which can be doped to form p-type and n-type materials for the production of p-i-n type photovoltaic devices which are, in operation, substantially equivalent to their crystalline counterparts. It is to be noted that the term "amorphous", as used herein, includes all materials or alloys which have long range disorder, although they may have short or intermediate range order or even contain, at times, crystalline inclusions.

It is now possible to prepare amorphous silicon alloys by glow discharge deposition or vacuum deposition techniques, said alloys possessing (1) acceptable concentrations of localized states in the energy gaps thereof, and (2) high quality electronic properties. Such techniques are fully described in U.S. Pat. No. 4,226,898, entitled Amorphous Semiconductors Equivalent To Crystalline Semiconductors, issued to Stanford R. Ovshinsky and Arun Madan on Oct. 7, 1980; U.S. Pat. No. 4,217,374, of Stanford R. Ovshinsky and Masatsugu Izu, which issued on Aug. 12, 1980, also entitled Amorphous Semiconductors Equivalent To Crystalline Semiconductors; and U.S. patent application Ser. No. 423,424 of Stanford R. Ovshinsky, David D. Allred, Lee Walter, and Stephen J. Hudgens entitled Method of Making Amorphous Semiconductor Alloys And Devices Using Microwave Energy. As disclosed in these patents and application, fluorine introduced into the amorphous silicon semiconductor layers operates to substantially reduce the density of the localized states therein and facilitates the addition of other alloying materials, such as germanium.

The concept of utilizing multiple cells, to enhance photovoltaic device efficiency, was described at least as early as 1955 by E. D. Jackson in U.S. Pat. No. 2,949,498 issued Aug. 16, 1960. The multiple cell structures therein discussed utilized p-n junction crystalline semiconductor devices. Essentially the concept employed different band gap devices to more efficiently collect various portions of the solar spectrum and to increase open circuit voltage (Voc). The tandem cell device (by definition) has two or more cells with the light directed serially through each cell. In the first cell a large band gap material absorbs only the short wavelength light, while in subsequent cells smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant.

Unlike crystalline silicon which is limited to batch processing for the manufacture of solar cells, amorphous silicon alloys can be deposited in multiple layers over large area substrates to form solar cells in a high volume, continuous processing system. Such continuous processing systems are disclosed in pending patent applications: Ser. No. 151,301, filed May 19, 1980, for A Method Of Making P-Doped Silcon Films And Devices Made Therefrom: Ser. No. 244,386, filed Mar. 16, 1981, for Continuous Systems For Depositing Amorphous Semiconductor Material: Ser. No. 240,493, filed Mar. 16, 1981, for Continuous Amorphous Solar Cell Production System: Ser. No. 306,146, filed Sept. 28, 1981, for Multiple Chamber Deposition And Isolation System And Method: Ser. No. 359,825, filed Mar. 19, 1982 for Method And Apparatus For Continuously Producing Tandem Amorphous Photovoltaic Cells: and Ser. No. 460,629 filed Jan. 24, 1983 for Method and Apparatus For Continuously Producing Tandem Amorphous Photovoltaic Cells. As disclosed in these applications, a substrate may be continuously advanced through a succession of deposition chambers, wherein each chamber is dedicated to the deposition of a specific semiconductor material. In making a photovoltaic device of p-i-n type configurations, the first chamber is dedicated for depositing a p-type semiconductor alloy, the second chamber is dedicated for depositing an intrinsic amorphous semiconductor alloy, and the third chamber is dedicated for depositing an n-type semiconductor alloy.

The layers of semiconductor material thus deposited in the vacuum envelope of the deposition apparatus may be utilized to form a photovoltaic device including one or more p-i-n cells, one or more n-i-p cells, a Schottky barrier, photodiodes, phototransistors, or the like. Additionally, by making multiple passes through the succession of deposition chambers, or by providing an additional array of deposition chambers, multiple stacked cells of various configurations may be obtained.

In many cases it is desirable to form electrically conductive patterns such as grids, networks and the like atop the transparent electrode of the previously described amorphous semiconductor alloy devices. In other cases it is desirable to incorporate a reflective metallic back layer in photovoltaic devices so as to redirect light that has passed through the active semiconductor material of the device through the active layer for a second time. The instant invention may be utilized in the production of these devices insofar as it offers a method for economically, and reliably producing said conductive patterns or conductive layers by a process which does not destroy the amorphous semiconductor alloy layers. Accordingly, the instant invention fufills a long felt need in the production of electronic devices incorporating transparent electrodes, and has special significance in the production of photovoltaic devices.

These and other advantages of the instant invention will become apparent from the drawings, the detailed description of the invention and the claims which follow.

BRIEF SUMMARY OF THE INVENTION

The present invention is directed toward an improved method of making an electronic or photovoltaic device which includes a transparent electrically conductive electrode onto which it is desired to from a metallic pattern. According to the method of the instant invention, the metallic pattern may be formed upon the transparent electrode through the use of an electro-plating process. The metallic material may either be (1) deposited to conform to the shape of a resist-pattern applied to the transparent electrode, (2) deposited as a continuous layer which is subsequently etched to conform to the shape of a desired pattern.

Pursuant to the inventive teachings embodied herein, wide varieties of metals, including nickel, copper, gold, silver, aluminum and chromium may be electroplated onto a transparent electrode material, such as indium tin oxide, tin oxide, and the like so as to form electronic devices such as photovoltaic devices, liquid crystal displays, photoconductive devices, photosensors and the like.

DETAILED DESCRIPTION OF THE DRAWINGS

I. THE PHOTOVOLTAIC DEVICE

Figure 1:
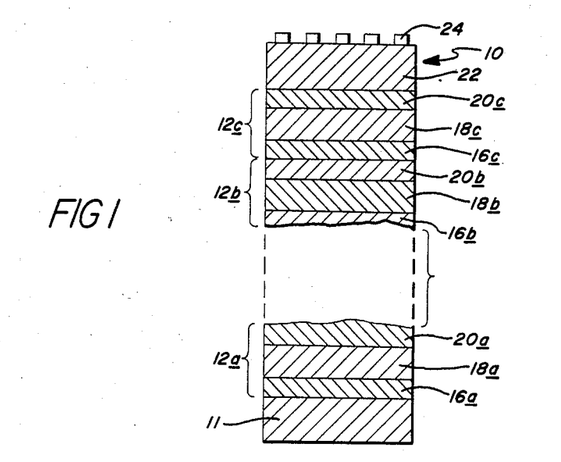
FIG. 1 is a fragmentary cross sectional view of a tandem photovoltaic cell comprising a plurality of p-i-n type cells, each layer of the cells including an amorphous semiconductor alloy.

Referring now to the drawings and particularly to FIG. 1, a photovoltaic cell formed of a plurality of successive p-i-n layers each of which include a semiconductor alloy is shown generally by the numeral 10. The method of the instant invention is specially adapted for use in the fabrication of cells of this type.

More particularly, FIG. 1 shows a p-i-n type photovoltaic device such as a solar cell made up of individual p-i-n type cells 12a, 12b and 12c. Below the lowermost cell 12a is a substrate 11, which (1) functions as the bottom electrode, and (2) may be transparent or formed from a metallic material such as stainless steel, aluminum, tantalum, molybdenum or chromium, with or without an insulating layer thereon, or an insulating material such as glass with or without metallic particles embedded therein. Although certain applications may require a thin oxide layer and/or a series of base contacts prior to deposition of the semiconductor material, for purposes of this application, the term, "substrate" shall include not only a flexible film, but also any elements added thereto by preliminary processing. The instant invention is especially well adapted to provide these elements, as will be obvious from the description which follows.

Each of the cells, 12a, 12b and 12c are fabricated with an amorphous semiconductor body containing at least a silicon or germanium alloy. Each of the semiconductor bodies includes an n-type conductivity semiconductor layer 20a, 20b and 20c; an intrinsic semiconductor layer 18a, 18b and 18c; and a p-type conductivity semiconductor layer 16a, 16b and 16c. As illustrated, cell 12b is an intermediate cell and, as indicated in FIG. 1, additional intermediate cells may be stacked atop the illustrated cells without departing from the spirit or scope of the present invention.

It is to be understood that following the deposition of the semiconductor layers, a further deposition process may be either performed in a separate environment or as a part of a continuous process. In this step, a TCO layer 22, formed in the preferred embodiment of indium tin oxide, also referred to herein as the top or upper electrode, is deposited atop the semiconductor material. A metallic pattern in the form of an electrode grid 24 may be applied to the device where the cell is of a sufficiently large area, or if the conductivity of the TCO layer 22 is insufficient. The grid 24 shortens the carrier path through the TCO and thus increases the conduction efficiency. The instant invention is specifically directed toward methods for the fabrication of metallic patterns such as the grid 24, or other like conductive networks adapted to be electroplated onto TCO materials.

While the cell illustrated in FIG. 1 is a stacked assembly of p-i-n type photovoltaic cells, the instant invention also has utility in the fabrication of other electronic devices such as single p-i-n cells, stacked or single n-i-p cells, p-n cells, Schottky barrier cells, photodetectors, liquid crystal displays and other electronic devices.

Figure 2:
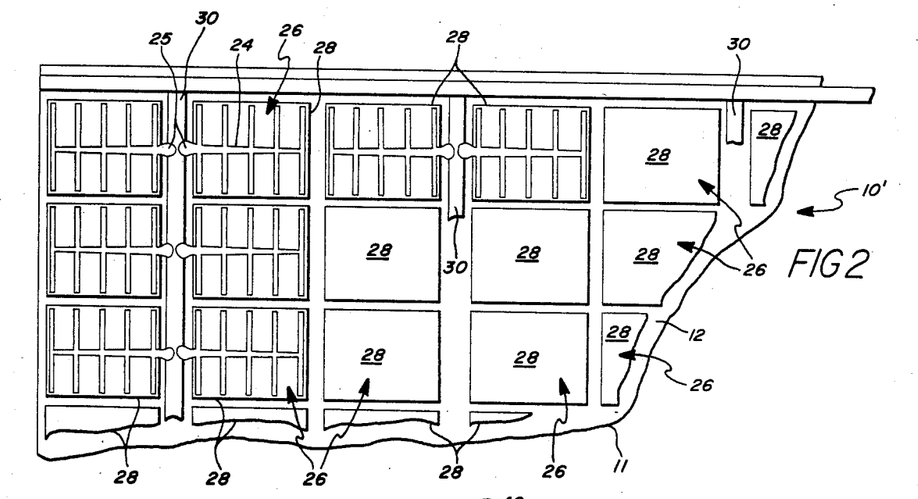
FIG. 2 is a fragmentary top plan view of a large area photovoltaic device comprising a plurality of isolated cells, each of which includes an electrically conductive grid pattern formed by electroplating a metallic material.

FIG. 2 is a fragmentary top plan view of a photovoltaic device 10' generally similar to the device depicted in cross section in FIG. 1. As can be seen from FIG. 2, the large area device 10' includes a continuous, large area substrate 11 having a continuous layer of the active semiconductive material 12 deposited thereon. The semiconductor surface of the large area photovoltaic device 10' has a plurality of electrically isolated portions 26 formed thereon, each of said isolated portions 26 adapted to contribute to the total electrical output of the large area device 10'.

As should be apparent, all of the isolated portions 26 share the common continuous substrate which therefore serves as a common bottom electrode. The electrically isolated portions 26 of the semiconductor material 12 are formed by discrete regions 28 of the transparent conductive oxide material which has been provided atop the semiconductor material 12. Each of these discrete regions 28 of transparent conductive oxide 22 function as the upper electrode of an individual small area photovoltaic cell. The individual small area cells thus formed are electrically isolated from adjacent small area cells because the relatively high conductivity of the TCO 22 collects current from the semiconductor layer directly thereunder so as to prevent electrical current from flowing laterally between the discrete regions 26.

Deposited atop each of the electrically isolated portions 26 is a current collection grid 24, previously described, which functions to provide a low resistance current path across the plurality of transparent conductive oxide electrodes formed on the large area device 10', thereby improving current collection 28. The grid 24 of each electrically isolated small area portion 26 is connected to a system of bus bars 30 which function to convey photogenerated current collected from each of the portions 26 to a central collection point. The grids 24 in FIG. 2 are shown connected to the bus bars 30 by connectors 25, such as dots of silver paste. In some applications it is desirable not to initially connect the grid 24 to the bus bars 30 thus allowing for electrical testing of each isolated portion 26 so as to only connect the portions 26 found to be electrically operable.

Both the bus bars 30 and the conductive grid 24 are desirably fabricated of a material having a relatively high electrical conductivity such as a metallic material. The instant invention provides a method for the fabrication of the grids 24 and/or the bus bar system 30 through an electroplating process.

II. DEPOSITING THE CONDUCTIVE PATTERN

Figure 3:
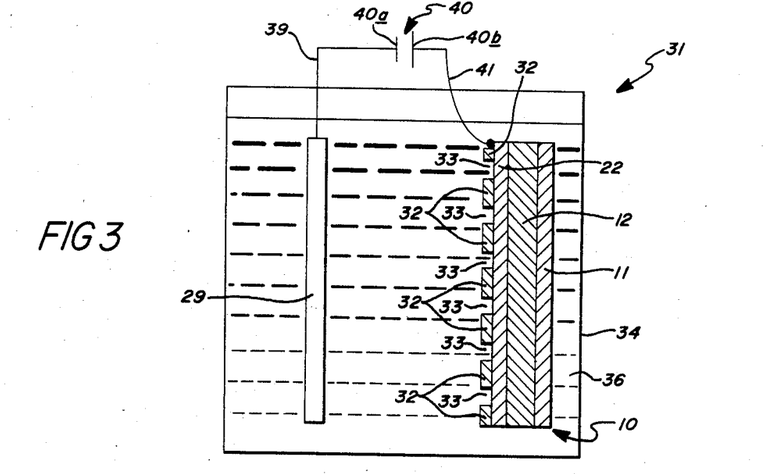
FIG. 3 is a schematic representation of batch process apparatus adapted to perform the electroplating process of the instant invention, i.e., adapted to electroplate a preselected metallic pattern onto the transparent electrode of an electronic device.

Referring now to FIG. 3, a batch process arrangement for electroplating a metallic electrically conductive pattern onto the TCO electrode of an electronic device is shown generally by the reference numeral 31. For purposes of illustration, the article having the electrically conductive metallic pattern electroplated thereonto is the photovoltaic device 10' depicted and previously described with reference to FIG. 2. The device 10' includes an electrically conductive substrate 11 a semiconductor body 12 and a transparent conductive oxide electrode 22. Obviously, this process is not limited to the method of electroplating a layer of metallic material onto a photovoltaic device, but may be utilized to electroplate a metallic material onto any transparent conductive oxide material regardless of whether the oxide is part of an electronic device, or is applied to a layer of glass, ceramic or the like.

The transparent conductive oxide layer 22 has formed thereon a preselected pattern 32 of electroplating resist material which functions to define non-resist coated regions 33 upon which the metallic material will be electroplated to thereby form the electrically conductive pattern. The electroplating resist pattern 32 may be formed by any technique well known in the art such as screen printing, offset printing, stenciling, photolithography, etc, and is preferably formed of materials such as lacquer, synthetic resins and the like. One material having particularly adapted for the formation of a electroplating resist pattern is MacuMask 9251-M manufactured by McDermid Corporation.

The photovoltaic device 10' is placed in a suitable container 34 having the plating bath 36 contained therein. Also placed in the container 34 is a second electrode 29. The composition of the plating bath 36 and the counterelectrode 29 will depend upon the particular metallic material being electroplated onto the TCO layer 22 of the device 10'. A source of electrical current such as a battery 40 has one terminal 40a thereof electrically connected to the second electrode 29 via wire 39 and the other terminal 40b thereof directly electrically connected via wire 41 to the layer of transparent conductive oxide material 22, thereby completing an electrical circuit through the electroplating bath 36.

It is to be noted at this point that direct electrical contact of the battery 40 to the TCO layer 22 rather than to the conductive substrate 11 is desirable when the electronic device being plated is a photovoltaic device 10'. If electrical contact is established to the substrate layer 11 several problems may arise. Most importantly, if contact is established through the substrate current must pass through the entire semiconductor body 12 to the TCO layer 22 if plating is to occur. This current will degrade or even destroy portions of the semiconductor material 12 rendering the device inoperable. Furthermore, electrical current flowing through the substrate layer 11 may cause plating to occur upon the back surface of the substrate layer 11. While not harmful in and of itself, formation of a plated substrate layer is undesirable since it results in inefficiencies in production due to increased plating times, depletion of plating reagents, and consumption of excess electrical current. Therefore, when photovoltaic devices are electroplated it is essential to effect electrical contact directly to the transparent conductive oxide layer 22. Such contact may be established by any means well known in the art including the use of clamping fixtures or electrically conductive adhesive. The voltage, current density, and composition of the electroplating baths are all dependent upon the object to be coated and the metallic material to be plated thereon.

As previously mentioned, the large area photovoltaic device 10' depicted in FIG. 2 includes discrete regions 28 of transparent conductive oxide. If these regions are formed prior to the plating step, electrical contact will have to be established to each region 28, individually. Obviously this would be a time-consuming process, therefore in most cases it would be more desirable to form the TCO layer as a continuous body, electroplate the grid pattern 24, and then scribe the TCO intgo electrically discrete regions 28, thus forming the isolated portions 26. Scribing of the TCO may be by any process known in the art such as masking and etching, physical abrasion, laser ablation or the like.

Upon completion of the electroplating reaction, the photovoltaic device 10' is disconnected from the battery 40 and removed from the plating solution 36. In most cases the plating resist material 32 is then removed so as to provide maximum transparency in those unplated regions. Obviously, it is not necessary to employ a pre-plating resist layer to form the grid pattern. For example, the entire surface of the transparent conductive oxide layer 22 could be electroplated and, in a second step, the preselected electrically conductive pattern 24 could be formed by photomasking and etching techniques. Such a post-plating etch step could be combined with a scribing step as described above.

Figure 4A:
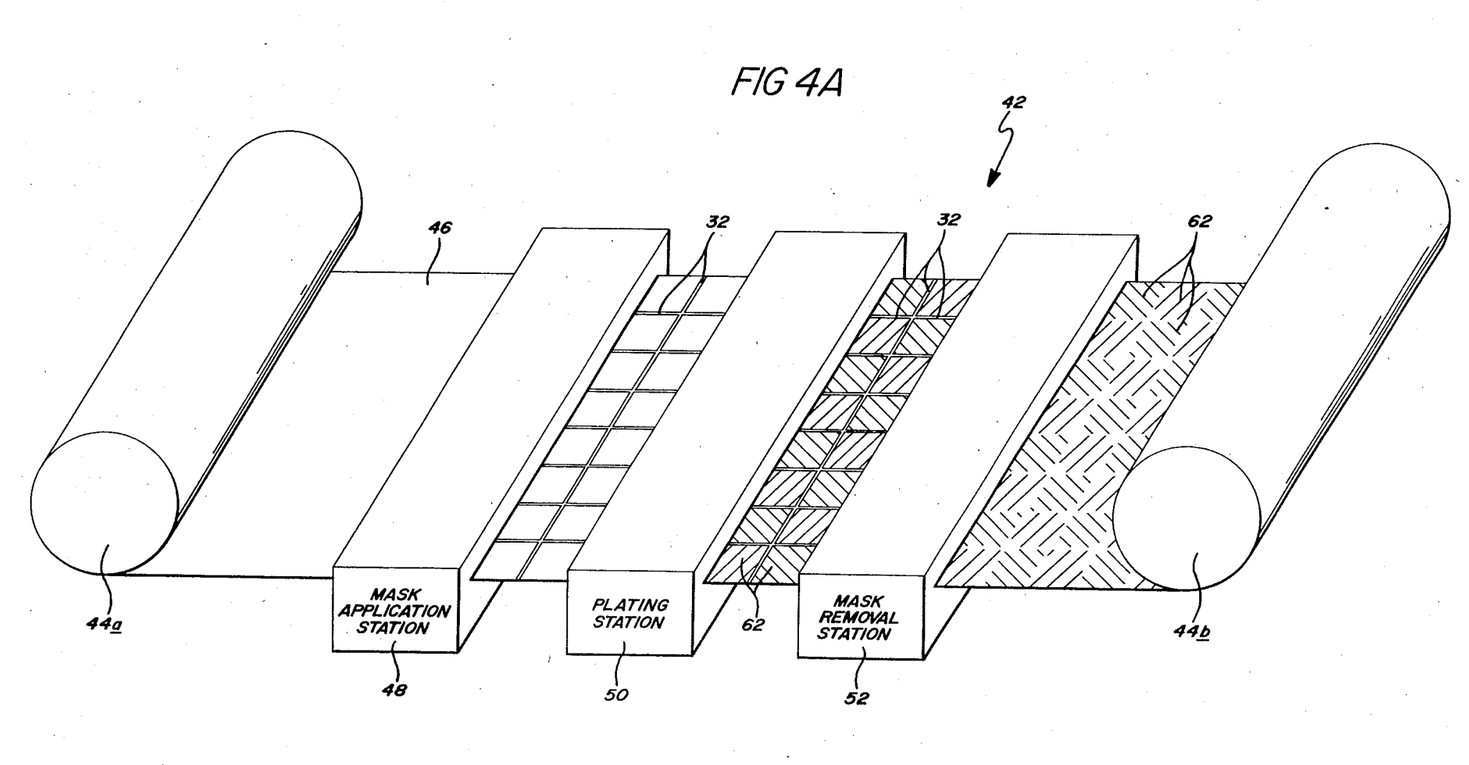
FIG. 4A is a perspective drawing of apparatus adapted to continuously electroplate a preselected metallic pattern onto a layer of transparent conductive oxide in a roll to roll process.

Referring now to FIG. 4A, an apparatus for continuously electrodepositing a metallic conductive pattern onto a TCO layer in a continuous roll-to-roll process is shown generally by the reference numeral 42. This apparatus 42 could be readily adapted to provide a grid pattern on large area photovoltaic devices, such as that illustrated in FIG. 2.

The apparatus includes a supply roller 44a, adapted to hold a roll of the TCO containing material 46, to be plated, and a take-up roller 44b, which collects the plated material. Also included in the apparatus are a plurality of work stations; namely: The mask application station 48, the plating station 50, and the mask removal station 52.

In operation, the web of TCO layered material 46 is continuously advanced from the supply roller 44a to the mask application station 48, where a plating resist pattern 32, is applied thereto. The plating resist pattern 32 may be formed by any process known in the art as previously described. The mask application station 48 may also included whatever ancillary equipment, such as drying equipment, as is necessary to assure proper formation of the resist pattern 32. The web of material 46 is advanced on to the plating station 50, where the actual deposition of the metallic material occurs.

Figure 4B:
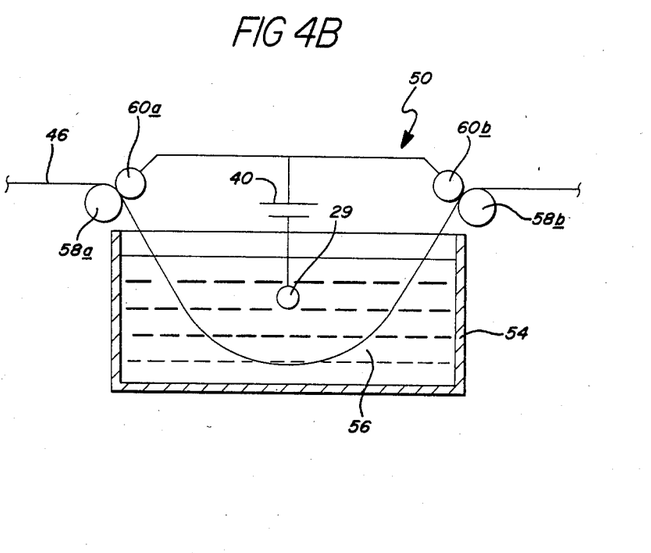

FIG. 4B depicts one possible embodiment of the plating station 50 structured in accord with the principles of the instant invention. The station 50 includes a tank 54 containing the plating solution 56, therein. The web of material 46 is guided through the plating solution 56 by a pair of guide rollers 58a, 58b, although obviously other guide means such as magnets and the like could serve the same function, Electrical contacat is made with the TCO layered surface of the web 46 by rollers 60a, 60b, which are electrically connected to a power source, such as a battery 40. The electrical circuit is completed by means of an electrode 29 immersed in the plating solution 56. As previously described, the composition of the bath 56, the quantity and polarity of the plating current, and the composition of the electrode 29 will depend upon the material being plated onto the TCO.

Referring back to FIG. 4A; after leaving the plating station 50, the web of material 46 advances to the mask removed station 52 where the plating resist is stripped away, leaving the plated pattern 62 on the web. This station may comprise, for example, a tank of solvent through which the masked web 46 passes; however, the exact nature of the mask removal station will depend upon the tupe of masking material employed. After removal of the mask, the patterned web of material is wound onto the take-up roll 44b for storage or further processing.

While the foregoing describes the electroplating process of the instant invention in general terms, the following examples will serve to more fully demonstrate the operation and advantages of the instant invention.

EXAMPLE 1

Nickel was electroplated in a preselected pattern onto the indium tin oxide surface (the TCO surface) of a p-i-n photovoltaic device in accord with the following procedure. The indium tin oxide surface of the photovoltaic device was cleaned by immersing it in a mild detergent solution having a pH of approximately 8. After one minute the cell was rinsed in deionized water. Electrical contact was made to the indium tin oxide layer by utilizing a spot of electrically conductive epoxy adhesive to cement a contact wire thereto. The device was then immersed into a mild (approximately 10%) sulfamic acid solution for 5 seconds and thereafter placed in a nickel sulfamate plating bath which was maintained at a temperature of 49° centigrade and had a pH of approximately 4. The nickel sulfamate bath is a commercially available product supplied by the Allied-Kelite Division of the Witco Chemical Company. A current of approximately 0.1 amperes at a bias of approximately −1 volt was applied to the four square inch sample device, thus providing an effective current density of 15 milliamps per square centimeter. The current was passed through the device for approximately one minute and resulted in the electroplating of a nickel layer onto the TCO material. The electroplated layer thus formed had good adhesion, a smooth surface and was approximately 0.2 microns thick. Of equal importance no damage occured to the cells of the photovoltaic device during the course of the plating process.

EXAMPLE 2

Copper was electroplated in a preselected pattern onto the indium tin oxide surface (the TCO layer) of a p-i-n photovoltaic device as follows. The sample to be plated generally identical to the sample utilized in Example 1 was cleaned rinsed, provided with electrical contact to a current source and immersed into a sulfamic acid solution as in the foregoing example. After the sulfamic acid dip, the photovoltaic device was placed into a copper sulfate plating bath, said bath supplied by the Allied-Kelite Division of the Witco Chemical Company. The plating bath was maintained at room temperature and had a pH of approximately 1. A current of approximately 0.2 amperes at a bias of −0.5 volts was passed through the bath. The sample was again 4 square inches in area, and the resulting current density was approximately 30 milliamps per centimeter squared. The current was passed through the device for 1 minute and resulted in an electroplated layer of approximately 0.2 micron thickness which exhibited good adhesion and a smooth surface. Again no cellular damage occured.

EXAMPLE 3

In this example an electrically conductive multi-layer sandwich was to be deposited in a preselected pattern upon the indium tin oxide surface (the TCO layer) of a photovoltaic device. The device, which was generally similar to the photovoltaic device plated in the first two examples, was prepared by washing with a mild detergent, rinsing, affixing an electrical contact to the indium tin oxide surface thereof, and dipping in sulfamic acid as per the previous two examples. The prepared sample was then placed in a nickel sulfamate electroplating bath at 40° centigrade and a pH of approximately 4. A current of 0.1 amperes at −1 volt bias was passed through the device for approximately one minute and resulted in a current density of approximately 15 milliamps per square centimeter flowing through the TCO. The current was shut off, the sample was rinsed in deionzied water and immersed in a copper sulfate plating bath maintained at room temperature and a pH of approximately 1. A current of 0.1 amp at −0.25 volts bias flowed through the TCO for one minute providing an effective current density of approximately 15 milliamps per square centimeter. The current was terminated, the sample rinsed in deionized water and reimmersed in the previously used nickel sulfamate bath. At a bias of −0.5 volts, a current of 0.1 amps flowed through the TCO for one minute, providing an effective current density of 15 milliamps per centimeter squared. Upon completion of these electroplating steps, the sample was removed from the bath, disconnected from the current source, rinsed and dried. The resulting tri-layer nickel-copper-nickel sandwich exhibited good adhesion, high electrical conductivity and presented a smooth surface. As with the previous examples, the cells of the photovoltaic device were not harmed.

EXAMPLE 4

Figure 5:
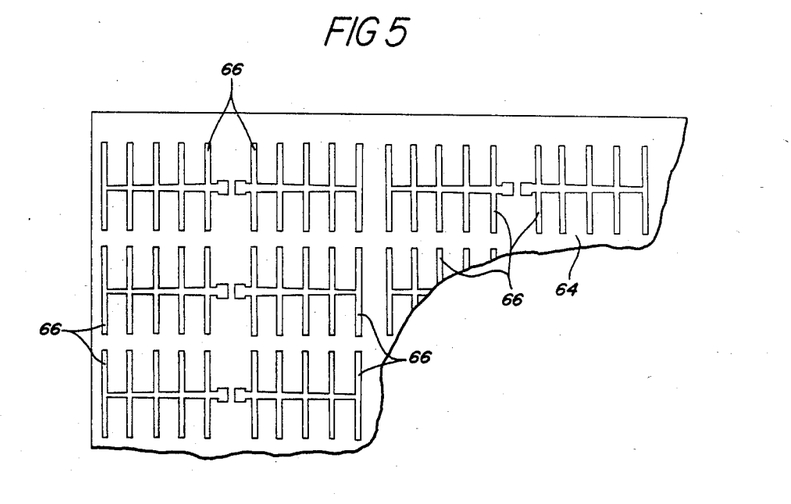
FIG. 5 is a fragmentary top plan view of a sheet of ITO coated glass which includes an electrically conductive grid pattern thereon formed aby electroplating a metallic material.

In this example a nickel pattern was electroplated in a preselected pattern onto a sample of ITO covered glass. A resist pattern was first screen printed onto the ITO layer utilizing MacuMask 9251-M manufactured by the McDermid Corporation. The resist coated glass was then cleaned by immersion in an alkaline detergent solution for approximately one minute, rinsed in deionized water, and immersed into a mild (approximately 10%) sulfamic acid solution for five seconds. Electrical contact was established by attaching an alligator clip to the conductive indium tin oxide coated glass. The ITO coated glass was then placed in a nickel sulfamate bath, maintained at 40° centigrade and a pH of approximately 4. A power supply was used to pass an electrical current of 0.4 amperes at a bias of −2 volts through the sample. After plating, the power supply was disconnected, the sample rinsed in water and the plating resist removed by washing with acetone. FIG. 5 illustrates the sheet of ITO coated glass 64, having the nickel plated pattern 66, thereon The pattern exhibits good adhesion, high electrical conductivity and good surface quality.

EXAMPLE 5

In this example a copper layer was deposited in a preselected pattern upon ITO coated glass in a process generally similar to the process described in Example 4. The ITO coated glass was cleaned, coated with a resist pattern, treated with sulfamic acid and placed in a copper sulfate electroplating bath at room temperature and a pH of approximately 1. Electrical contact was made to the conductive ITO layer by means of an alligator clip, and the power supply provided a current of approximately 1 ampere at a bias of −1 volt potential through the sample. After approximately 1 minute the power supply was disconnected, the sample removed from the plating bath, the sample rinsed in water, and the resist layer removed from the sample with acetone. This procedure resulted in the formation of the preselected pattern of copper which exhibited good adhesion, high electrical conductivity and surface quality upon the ITO layer.

While the foregoing examples describe the use of nickel or copper plating baths, other plating baths such as silver gold, chromium and the like can be employed in a similar manner for electroplating those metals onto a transparent conductive layer. Furthermore, while the foregoing description and examples have been directed toward fabrication of a conductive metallic layer upon a transparent conductive electrode, the invention's utility is not so limited. For example, pursuant to the principles of the method disclosed herein a metallic pattern may be formed upon a layer of glass or any other material having a transparent conductive oxide material deposited thereon. Such a pattern may have utility in fields other then electronics. For example, metallic coated glass may have decorative applications, or it may have utility as a filter for light. The foregoing description and examples are merely illustrative of the utility of the instant invention, and are not intended as limitations thereon. It is the claims which follow, including all equivalents, which define the scope of the invention.

What we claim is:

1. An improved method of applying an electrically conductive metallic material in a preselected pattern directly onto a substantially transparent, electrically conductive layer of an electronic device; the method including the steps of:
   selecting said substantially transparent, electrically conductive layer from layers formed from materials consisting essentially of: tin oxide, indium oxide, zinc oxide and combinations thereof;
   cleaning the substantially transparent, electrically conductive layer;
   immersing the substantially transparent, electrically conductive layer in an electroplating bath;
   providing a counter electrode in the electroplating bath;
   providing a source of direct current;
   establishing electrical communication between (a) a first terminal of the source of direct current and the substantially transparent, electrically conductive layer and (b) a second terminal of the source of direct current and the counter electrode;
   activating the source of direct current, and electroplating the metallic material onto the substantially transparent, electrically conductive layer.

2. A method as in claim 1 wherein the step of establishing electrical communication includes the further step of: establishing electrical contact from a first terminal of the source of direct current directly to the transparent conductive layer.

3. A method as in claim 1 further comprising the step of: providing a plating resist layer atop preselected areas of the transparent electrically conductive layer, prior to the electroplating thereof, said preselected areas corresponding to portions of the transparent layer which will not have the conductive pattern thereon, whereby said conductive pattern is only formed upon the transparent electrically conductive layer.

4. A method as in claim 1, further comprising the steps of: providing an etch resist layer atop preselected areas of the electrically conductive metallic material, after said material is electroplated onto the transparent electrically conductive layer; the preselected areas corresponding to said preselected pattern of electrically conductive metallic material; and etching the electrically conductive metallic material not covered by the resist layer, whereby said preselected pattern is formed upon the transparent electrically conductive layer.

5. A method as in claim 1, further comprising the step of: selecting the electrically conductive metallic material from the group consisting essentially of: copper, nickel, silver, gold, aluminum, chromium and mixtures thereof.

6. A method as in claim 1 wherein the step of electroplating the electrically conductive metallic material includes the further step of electroplating a layer of nickel.

7. A method as in claim 1 wherein said electronic device is a liquid crystal display.

8. A method as in claim 1 wherein the electronic device is formed upon an elongated web of material, and wherein the step of electroplating includes the step of: continuously advancing the web of material through a plating station, said plating station adapted to continuously electroplate the electrically conductive metallic material onto the transparent electrically conductive layer.

9. A method as in claim 1 wherein the step of electroplating the electrically conductive metallic material includes the further steps of: electroplating a layer of nickel; and electroplating a layer of copper, the two electroplated layers being substantially co-extensive.

10. A method as in claim 1 wherein said electronic device is a photodetector.

11. A method as in claim 1 wherein said electronic device is a photoconductive device.

12. A method as in claim 1 wherein said electronic device is a photovoltaic device.

13. An improved method of applying an electrically conductive metallic material in a preselected pattern directly onto the substantially transparent electrically conductive layer of a photovoltaic device which comprises: a first electrode; an active semiconductor body including an amorphous silicon alloy, said body having a first surface which is disposed in electrical communication with the first electrode, the semiconductor body adapted to provide for the flow of electrical current in response to the absorption of light incident thereon; a second electrode formed of a layer of substantially transparent electrically conductive material, a first surface of the second electrode disposed in electrical communication with a second surface of the semiconductor body; and an electrically conductive metallic pattern formed from a layer of electrically conductive metallic material disposed in electrical contact with the second surface of the second electrode; the method including the steps of:

selecting said substantially transparent, electrically conductive layer of material from the group consisting essentially of: tin oxide, indium oxide, zinc oxide, and combinations thereof;

cleaning the substantially transparent, electrically conductive layer;

immersing the substantially transparent, electrically conductive layer in an electroplating bath;

providing a counter electrode in the electroplating bath;

providing a source of direct current;

establishing electrical communication between (a) a first terminal of the source of direct current and the substantially transparent electrically conductive layer and (b) a second terminal of the source of direct current and the counter electrode;

activating the source of direct current, and electroplating the metallic material onto the substantially transparent, electrically conductive layer.

14. A method as in claim 13 further including the step of electroplating the electrically conductive material onto the first electrode.

15. A method as in claim 13 wherein the step of establishing electrical communication includes the further step of: establishing electrical contact from a first terminal of the source of direct current directly to the transparent conductive layer.

16. A method as in claim 13 futher comprising the step of: providing a plating resist layer atop preselected areas of the second electrode prior to the electroplating of the second electrode; said preselected areas corresponding to portions of the second electrode which will not have the conductive pattern thereon, whereby said electrically conductive pattern is only formed upon the second electrode.

17. A method as in claim 13, further comprising the step of: providing an etch resist layer atop preselected areas of the metallic material, after the material is electroplated onto the second electrode, said preselected areas corresponding to said electrically conductive metallic pattern; and etching the electrically conductive metallic material not covered by the resist layer, whereby said electrically conductive metallic pattern is formed upon the second electrode.

18. A method as in claim 13 further comprising the step of: selecting the electrically conductive metallic material from the group consisting essentially of: copper, nickel, silver, gold, aluminum, chromium and mixtures thereof.

19. A method as in claim 13 wherein the step of electroplating the electrically conductive metallic material comprises electroplating a layer of nickel.

20. A method as in claim 13, wherein the step of electroplating the electrically conductive metallic material comprises electroplating a layer of copper.

21. A method as in claim 13, wherein the step of electroplating the electrically conductive metallic material includes: electroplating a layer of nickel; and electroplating a layer of copper, the two electroplated layers being substantially co-extensive.

22. A method as in claim 13 wherein the photovoltaic device is formed upon an elongated web of material, and wherein the step of electroplating includes the step of: continuously advancing the web of material through a plating station, said plating station adapted to continuously electroplate the electrically conductive metallic material onto the second electrode.

* * * * *